United States Patent [19]
An

[11] 4,408,330
[45] Oct. 4, 1983

[54] FIELD EFFECT SEMICONDUCTOR LASER, METHOD OF MODULATION THEREOF

[75] Inventor: Seiji An, 10-3, Nishiawaji 4-chome, Higashiyodogawa-ku; Osaka City, 533, Japan

[73] Assignees: Kabushiki Kaisha Towa Giken; Seiji An, both of Osaka, Japan; part interest to each

[21] Appl. No.: 213,333

[22] Filed: Dec. 5, 1980

[30] Foreign Application Priority Data

Dec. 7, 1979 [JP] Japan .............................. 54-159460

[51] Int. Cl.³ ............................................. H01S 3/19
[52] U.S. Cl. ..................................... 372/45; 357/17; 372/46; 372/50
[58] Field of Search ....................... 372/50, 45, 26, 46; 357/41, 17

[56] References Cited

U.S. PATENT DOCUMENTS 4,212,020  7/1980  Yariv et al. .......................... 372/50

OTHER PUBLICATIONS

App. Phys. Lett. vol. 29, No. 10, Nov. 15, 1976, pp. 652–654.
An et al, "Field Effect Semiconductor Lasers", *IEEE Journal of Quantum Electronics*, vol. QE-16, No. 12, Dec. 1980, pp. 1300–1302.
Fukuzawa et al., "Monolithic Integration of a GaAlAs Injection Laser with a Schottky-Gate Field Effect Transistor", Appl. Phys. Lett., vol. 36, No. 3, Feb. 1, 1980, pp. 181–183.
Yust et al., "A Monolithically Integrated Optical Repeater", Appl. Phys. Lett. vol. 35, No. 10, Nov. 15, 1979, pp. 795–797.
Reinhart et al., "Electro-Optic Frequency- and Polarization-Modulated Injection Laser", Appl. Phys. Lett, 36(12), Jun. 15, 1980, pp. 954–957.
Ury, et al. "Monolithic Integration of an Injection Laser and a Metal Semiconductor Field Effect Transistor", Appl. Phys. Lett., 34(7), 4/1/79, p. 430.

*Primary Examiner*—James W. Davie
*Attorney, Agent, or Firm*—Cushman, Darby & Cushman

[57] ABSTRACT

A field effect semiconductor laser has two clad layers and an active layer therebetween, formed by an epitaxial growth on a semiconductor substrate, which is mesa-etched to form a stripe-shaped mesa part of a double heterostructure on the semiconductor substrate. The laser further includes first and second buried layers of conductivity types opposite to each other and formed on both sides of the mesa-etched part, respectively. Gate electrodes G are formed on at least one of the top faces of the buried layers, and a drain electrode D is formed on the mesa-etched double heterostructure part. Depletion layers are produced at the junction interfaces between the first and the second buried layers when a reverse-bias voltage is applied across pairs of these buried layers. The thickness of the depletion layers, and thus a refractive index of a part of the buried layer neighboring outside the active layer, can be controlled by changing the external voltage applied to the gate electrode G, and the laser oscillation can be directly controlled by a voltage signal thereby enabling effective and high speed modulation of the laser.

28 Claims, 21 Drawing Figures

FIG. 2 (c)
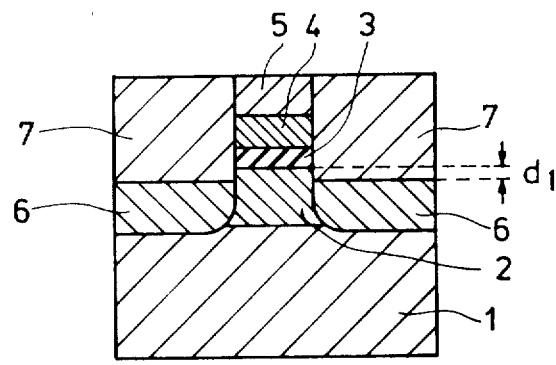
FIG. 3 (a)
FIG. 3 (b)
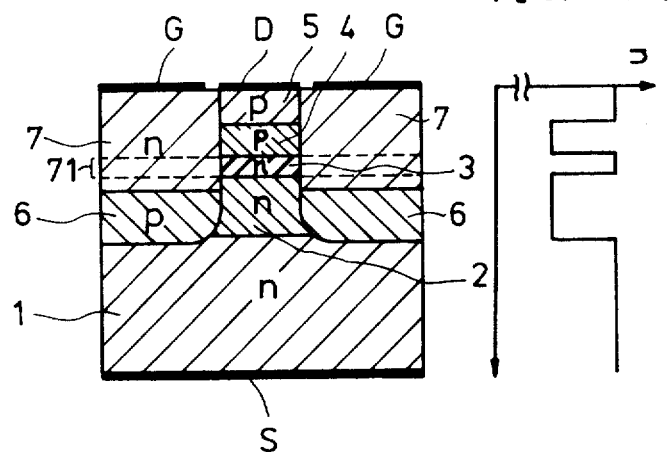
FIG. 4
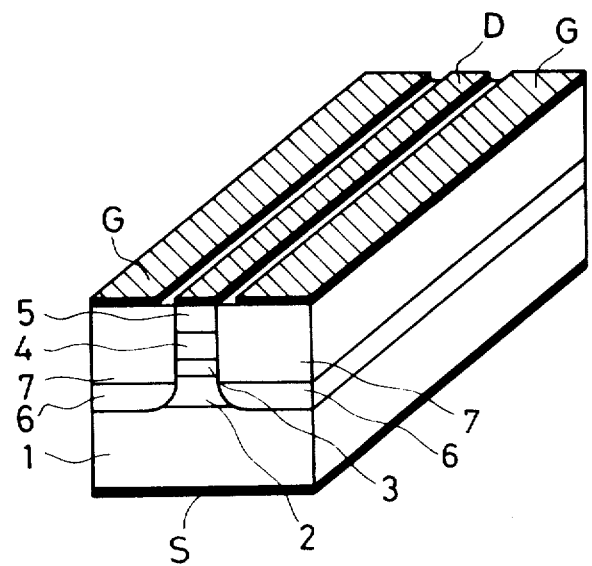

FIELD EFFECT SEMICONDUCTOR LASER, METHOD OF MODULATION THEREOF

BACKGROUND OF THE INVENTION

1. Field of the Invention

The present invention relates to a field effect semiconductor laser, a method of modulation thereof and a method of making the same, and especially the one where an oscillation condition of the semiconductor laser can be directly controlled by an external control voltage applied thereto.

2. Prior Art

In a conventional semiconductor laser, in order to modulate an oscillation signal of the semiconductor laser, a current supplied to the semiconductor laser was changed, thereby modulation of a laser light corresponding to the change of the current was obtained. However, in such a conventional semiconductor laser of a current driving type, the switching speed was limited to several GHz.

On the other hand, a new device including a semiconductor laser and a field effect transistor in one chip has been already proposed, e.g. by Ury et al., American Institute of Physics, Appl. Phys. Lett. 34(7), Apr. 1, 1979, p. 430 to 431.

In such device, a current passing through a pn junction of the semiconductor laser is made by a channel current of the field effect transistor, thereby oscillating strength of the device can be changed by the gate voltage of the field effect transistor. However, in this device, since the oscillation condition is indirectly changed through the FET, its switching speed is not so high, and the structure of the device is very complex.

SUMMARY OF THE INVENTION

The present invention provides a field effect semiconductor laser, a method of modulation thereof and a method of making the same, in which lasing of the laser can be controlled directly by the external voltage impressed at the gate electrode. The present invention is accomplished by utilizing a phenomenon in the semiconductor laser that the refractive index of the semiconductor material changes in response to the electric field strength and carrier concentration therein.

BRIEF DESCRIPTION OF THE DRAWINGS

FIG. 3(a) is schematic sectional elevation view of the semiconductor laser in accordance with the first embodiment of the present invention.

FIG. 3(b) is a graph showing distribution of the refractive index n with respect to the central vertical axis of the semiconductor laser of FIG. 3(a).

FIG. 4 is a perspective view of the semiconductor laser of FIG. 3(a).

DESCRIPTION OF THE PREFERRED EMBODIMENTS

The present invention provides a field effect semiconductor laser comprising:
a semiconductor substrate,
a stripe-shaped mesa part of a double heterostructure including a first clad layer, an active layer, and a second clad layer on the top face of the semiconductor substrate in this order, both of the first and second clad layers having lower refractive indices than that of the active layer,
buried layers buried in both side parts of the stripe-shaped mesa part on the semiconductor substrate,
a source and a drain electrodes provided on the bottom surface of the semiconductor substrate and on the second clad layer, respectively, and
a gate electrode formed on at least one of the second buried layers,
light reflecting faces at both ends of the active layer being cleavage planes of (011),
each of the buried layers comprising a first buried layer formed on the semiconductor substrate and a second buried layer thereon, and the first and the second buried layers having conductivity types from each other so that these buried layers are reverse-biased when a voltage of the same direction as the forward voltage to be applied to the stripe-shaped mesa part is applied to the second buried layer and,
the first buried layers being formed in a manner that junction planes between the first and second buried layers are disposed at a specific position that depletion layers generated between the first and second buried layers at applying the reverse-bias voltage are adjacent to the active layer.

The present invention will be explained hereinafter referring to the attached drawings.

Figure 1:
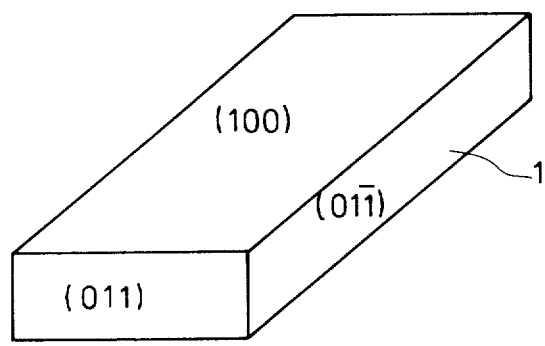
FIG. 1 is a perspective view of a semiconductor substrate employed in the present invention.
Figure 2:
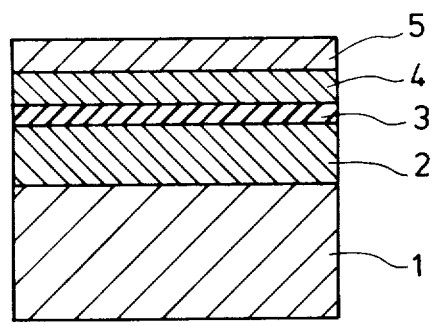
FIGS. 2(a), 2(b) and 2(c) are schematic sectional elevation views of various steps of making of a first example of the semiconductor laser in accordance with the present invention.
Figure 2:
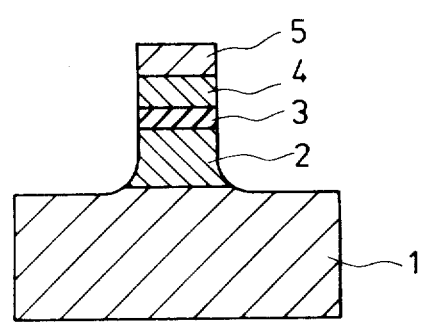

A method of making the field effect semiconductor laser in accordance with the present invention is explained below referring to FIGS. 1 to 4. FIG. 1 shows a semiconductor laser substrate 1 as a starting material of the present invention. In this embodiment, an n-type GaAs substrate 1 doped with Sn and has an impurity concentration of the order of $10^{18}$ cm$^{-3}$ is used and (011) faces are selected for cleavage planes which are to be reflecting faces of laser light in order to increase the refractive index at an impression of an electric field thereacross. As shown in FIG. 2(a), a first clad layer 2 of n-type Ga$_{1-x}$Al$_x$As (x=0.3 to 0.5) which includes aluminum atoms of an impurity concentration of the order of $10^{17}$ cm$^{-3}$, is formed on the top (100) face of the semiconductor substrate 1 by a known sequential epitaxial growth method. Then, an n-type GaAs layer 3, which is undoped, has the same conductivity type as that of the first clad layer 2 and is to be an active layer, is formed on the first clad layer 2 by 0.15 μm by the known sequential epitaxial growth method, thereby a hetero junction is formed between these two layers. A carrier concentration of the n-type GaAs layer 3 is selected to be of the order of $10^{16}$ cm$^{-3}$. Then a second clad layer 4 of p-type Ga$_{1-y}$Al$_y$As (y=0.3 to 0.5) is formed on the active layer 3 by the known sequential epitaxial growth method, thereby a hetero junction is formed between the active layer 3 and the second clad layer 4. By such processes, a known double heterostructure including the active layer between two clad layers 2 and 4 of low refractive indices is obtained.

Next, a cap layer 5 of p-type GaAs doped with Ge and having an impurity concentration of the order of $10^{17}$ cm$^{-3}$ is formed by the sequential epitaxial growth method on the second clad layer 4 so as to form an ohmic contact electrode thereon. And then the semiconductor layers 2, 3, 4 and 5 grown by the sequential epitaxial growth method are mesa-etched retaining its center portion (having a width of about 10 μm) thereof as shown in FIG. 2(b). First buried layers 6 of p-type Ga$_{1-z}$Al$_z$As (z=0 to 0.5) doped with Ge are formed at the removed part on the mesa-etched recesses of the semiconductor substrate 1 by a secondary sequential epitaxial growth method. The carrier concentration of the first buried layers 6 is selected to be of the order of $10^{18}$ cm$^{-3}$ and a difference of level between a hetero junction interface between the first clad layer 2 and the active layer 3 and a surface of the first buried layers 6 is selected to be about $\alpha_1 \approx 0.2$ μm as shown in FIG. 2(c). Furthermore, second buried layers 7 of n-type GaAs doped with Sn are formed on the first buried layers 6 up to the same level as the cap layer 5 by epitaxial growth method. The carrier concentration of the second buried layers 7 is selected to be within a range of $1 \times 10^{16}$ to $5 \times 10^{17}$ cm$^{-3}$, and preferably at $1 \times 10^{17}$ cm$^{-3}$. And then a source electrode S and a drain electrode D for ohmic contacts are formed on both sides of the semiconductor substrate 1 and the cap layer 5, respectively. Gate electrodes G for ohmic contacts are formed on the second buried layers 7 keeping a predetermined gap, e.g. several μm to the drain electrode D as shown in FIGS. 3(a) and 4. As a result of the abovementioned process the semiconductor laser in accordance with the present invention is manufactured.

Figure 5:
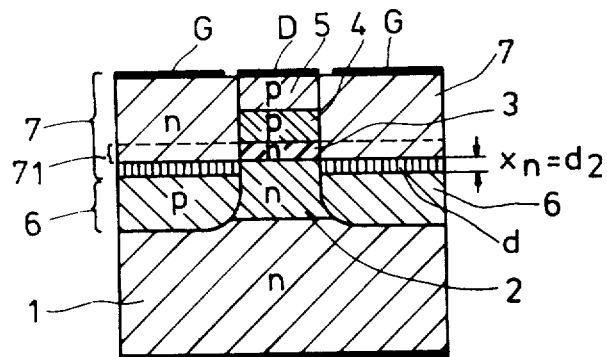
FIG. 5(a) and FIG. 6(a) are schematic sectional elevation views when a low and a high voltage are applied to the gate electrodes, respectively.
FIG. 5(b) and FIG. 6(b) are graphs showing refractive index distribution with respect to lateral direction of the active layer.
Figure 5:
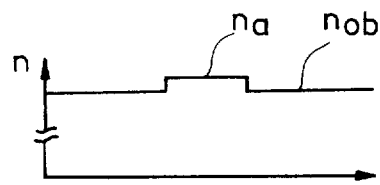
Figure 6:
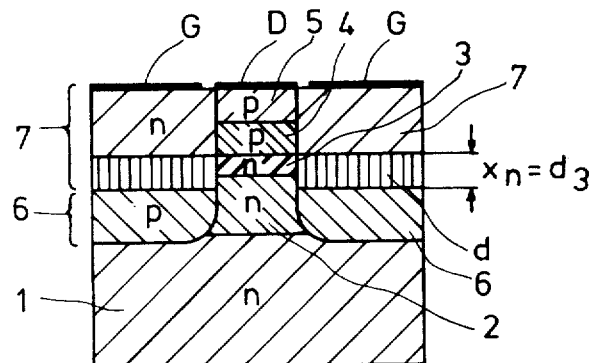
Figure 6:
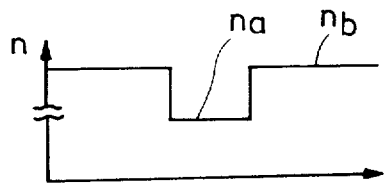

The function and operation of this semiconductor laser will be explained referring to FIGS. 3(b), 5 and 6. FIG. 3(b) shows a distribution of refractive index n at a vertical center portion of the semiconductor laser when fractions x and y of aluminum concentrations of the first and second clad layers 2 and 4 are selected to be substantially equal. The refractive indexes of only the first and second clad layers 2 and 4 are lower than those of the other layers since these clad layers 2 and 4 contain aluminum atoms. Therefore, with respect to the vertical directions, laser light is confined in the active layer 3. In this device, depletion layers are generated in the interface between the buried layers 6 and 7 when a reverse-bias voltage (a positive voltage against the source electrode S) is applied to the gate electrode G. In this case, since the cleavage plane is selected to be (011) plane as mentioned above, a refractive index n in the depletion layers in the buried layers 7 for a TE mode lasing is expressed by the following equation.

$$n = n_0 + \Delta n(\Delta N) + \Delta n(E) \quad (1),$$

where $n_0$ ... a refractive index in the clad layer 7, $\Delta n(\Delta N)$ ... a refractive index change based on the carrier concentration difference between before and after a generation of the depletion layer, and $\Delta n(E)$ ... a refractive index change based on the electrooptic effect.

$\Delta n(\Delta N)$ is expressed as follows:

$$\Delta n(\Delta N) = \frac{\Delta N e^2}{2 n_0 \epsilon_0 m^* \omega^2}, \quad (2)$$

where $\epsilon_0$ ... dielectric constant in vacuum $m^*$ ... effective mass of electron $\omega$ ... angular frequency of lasing $e$ ... electronic charge $\Delta N$ ... carrier concentration difference.

From the abovementioned equation (2), in case of the refractive index $n_0 = 3.6$ and the wavelength of the light $\lambda = 0.85$ μm, and when the carrier concentration difference $\Delta N$ is $1 \times 10^{17}$ cm$^{-3}$, the refractive index change $\Delta n(\Delta N)$ becomes $1.4 \times 10^{-4}$. When $\Delta N$ is within a range of $1 \times 10^{16}$ to $5 \times 10^{17}$ cm$^{-3}$, the refractive index change $\Delta n(\Delta N)$ becomes within a range of $1.4 \times 10^{-5}$ to $7 \times 10^{-4}$.

The refractive index change $\Delta n$ (E) can be given as follows:

$$\Delta n(E) = \tfrac{1}{2} n_0^3 r E \quad (3),$$

where $r$ ... electrooptic coefficient, and $E$ ... electric field strength.

As clearly seen from the equation (3), the refractive index change $\Delta n(E)$ is in proportion to the electric field strength E. In the semiconductor laser of the present invention, the electric field strength E is determined by the reverse-bias voltage across the source and gate electrodes S and G, and a thickness of the depletion layer which is generated by an application of the reverse-bias voltage. The thickness $x_n$ of the depletion layer in an n-type layer can be given as follows:

$$x_n = \left( \frac{2\epsilon(V_0 - V)}{q(N_D^+ - N_A^-)} \right)^{\frac{1}{2}}, \quad (4)$$

where $\epsilon$ ... dielectric constant of the buried layer, $V$ ... reverse-bias voltage, $V_0$ ... diffusion voltage (1.64 V), and $(N_D^+ - N_A^-) = n$ ... n-type carrier concentration.

When the carrier concentration n is $1 \times 10^{17}$ cm$^{-3}$, the thickness $x_n$ of the depletion layer is 0.15 μm when the applied bias voltage is zero, and the thickness $x_n$ are 0.211 μm and 0.34 μm when the applied bias voltage V are 1.43 V and 6.40 V, respectively.

When a drain voltage $V_D$ and a gate voltage $V_G$ against the source electrode S are selected equally to be 1.43 V, a forward-bias voltage becomes supplied to a pn hetero junction between the second clad layer 4 and the active layer 3 in a central part of the semiconductor laser, and therefore a forward current flows from the drain electrode D to the source electrode S. On the other hand, when the reverse-bias voltge is applied to the pn junction between the first and second buried layers 6 and 7, thereby depletion layers d are produced on the both sides of the pn junction as shown in FIG. 5(a). Therefore, the drainsource forward current does not spread to the lateral direction. The thickness of the depletion layers is in proportion to the square root of the applied voltage as abovementioned. In case the carrier concentration of the buried layers 7 is $10^{17}$ cm$^{-3}$, the thickness $d_2$ of the depletion layer in the buried layers 7 becomes 0.211 µm. As mentioned above, since the difference $d_1$ from the junction plane between the active layer 3 and the first clad layer 2 to the upper face of the first buried layers 6 is selected to be about 0.2 µm, a lower face of the active layer 3 and an upper face of the depletion layers d become substantially at a same level. In this case, the refractive index of the active layer 3 becomes a value $n_a$ determined by the carrier concentration of the active layer 3. A refractive index in thin layers 71, which are intermediate portions of the buried layers 7 adjacent to the active layer 3 (shown by range under a dotted line in FIG. 5(a), become a value $n_{0b}$ determined by a carrier concentration in the thin layers 71. When the carrier concentration of the active layer 3 is $10^{16}$ cm$^{-3}$, and that of the thin layer 71 is $10^{17}$ cm$^{-3}$, the difference of these two refractive indexes ($n_a-n_{0b}$) based on the carrier concentration difference is about $1\times10^{-4}$. The refractive index $n_a$ of the active layer 3 is slightly higher than that of the thin layers 71, as shown in FIGS. 5(b). Since the refractive index of the active layer 3 is higher than the layers neighboring thereto, laser light is confined in the lateral direction. Therefore, if a current larger than a specified value is fed between the drain and source electrodes D and S, light reflection is performed between the both end faces of the active layer 3 and laser oscillation can be obtained.

Next, when the gate voltage $V_G$ is increased to 6.4 V, while keeping drain voltage $V_D$ at 1.43 V, the depletion layers d spread upwards into the second buried layers 7 and grow thicker by the increase of the reverse-bias voltage due to the increase of gate voltage $V_G$ as shown in FIG. 6(a). That is, the thickness $d_3$ of the depletion layer d on the side of the buried layers 7 becomes, as mentioned above, 0.34 µm. As the thickness of the active layer 3 is about 0.15 µm, the thin layer 71 is approximately contained within the spreaded depletion layer d. Hereupon, the electric field strength E in the depletion layer d is given by the following equation.

$$E = \frac{V_D + V_G}{d_0}, \quad (5)$$

where
$d_0$ ... thickness of the depletion layer d,
$V_D$ ... diffusion voltage (1.64 V), and
$V_G$ ... applied voltage.
When $V_G$ is 6.4 V, the electric field strength E becomes $2.35\times10^5$ V/cm. Therefore, the refractive index change $\Delta n(E)$ can be obtained from the equation (3) as follows:

$$\Delta n(E) = 8\times10^{-4}.$$

Since the carrier concentration in the depletion layer becomes very small, the carrier concentration difference $\Delta N$ between the values before and after the generation of the depletion layer in the thin layers 71 becomes approximately equal to the carrier concentration of the buried layer 7 per se, namely $1\times10^{17}$ cm$^{-3}$. Therefore, the refractive index change based on the carrier concentration difference is, as mentioned above, $1.4\times10^{-4}$ according to equation (2). Consequently, the refractive index $n_b$ in the thin layers 71 on both sides of the active layer 3 is, $$n_b = n_{0b}+\Delta n(\Delta N)+\Delta n(E) = n_{0b}+1.4\times10^{-4}+8\times10^{-4}.$$

Since the drain voltage $V_D$ is kept at 1.43 V, the refractive index $n_a$ in the active layer 3 does not change, and is larger than the former refractive index $n_{0b}$ by $1\times10^{-4}$. Hence the difference between them can be given as follows:

$$n_b-n_a = n_{0b}+9.4\times10^{-4}-(n_{0b}+1\times10^{-4})=8.4\times10^{-4}.$$

After all, when a voltage higher than the drain voltage $V_D$ is applied to the gate electrodes G, the refractive index in the active layer 3 is lower than that of the thin layers 71 outside the active layer 3. Therefore, the laser light can not be confined in the active layer 3, and therefore the laser oscillation stops. As a result of this, the laser oscillation can be stopped by the change of the gate voltage $V_G$, and the intensity of the oscillation can be also changed by the continuous change of the gate voltage $V_G$.

Hereupon, the carrier concentration of the buried layers 7 is $1\times10^{17}$ cm$^{-3}$ in the present embodiment, but this can be selected to be within the range of $1\times10^{16}$ to $5\times10^{17}$ cm$^{-3}$. While the carrier concentration of the active layer 3 is $1\times10^{16}$ cm$^{-3}$, but it can be selected to be within a range of $5\times10^{15}$ to $5\times10^{16}$ cm$^{-3}$. At such selections, since the refractive index in the active layer 3 has to be slightly higher than that of the buried layers 7 by the carrier concentration difference between them, the carrier concentration of the active layer 3 should be selected slightly higher than or at least equal to that of the buried layers 7. Incidentally, it is difficult to manufacture the active layer 3 with the carrier concentration of less than $5\times10^{15}$ cm$^{-3}$, and if the carrier concentration in the n-type active layer is more than $5\times10^{16}$ cm$^{-3}$, it is difficult to make the laser oscillate because an absorption coefficient of the laser light is low. When the carrier concentration of the buried layers 7 is selected to be more than $5\times10^{17}$ cm$^{-3}$, the thickness of the depletion layers d becomes thin. In this case, the gate voltage $V_G$ has to be set large in order to change all parts of the thin layers 71 to the depletion layer, thereby the field strength in the depletion layer becomes high and it may cause breakdown of the semiconductor laser.

Furthermore, all layers of the semiconductor laser can be structured by an opposite conductivity type, respectively. In such a case, the active layer 3 is of p-type, and a carrier concentration thereof is selected to be within a range of $1\times10^{17}$ to $1\times10^{18}$ cm$^{-3}$. Carrier concentrations in the other layers than the active layer 3 may be in the same ranges as those exemplified above. In the embodiment, the carrier concentration of the burieds first buried layers 6 is $1\times10^{18}$ cm$^{-3}$, but can be selected to lie within a range of $1\times10^{17}$ to $5\times10^{18}$ cm$^{-3}$. The carrier concentration of the buried layers 6 should be selected to be much larger (for example, by one order) than that of the buried layers 7. The reason is that if the thickness of the depletion layer produced in the buried layers 6 is negligibly small, the decrease of the field strength can be prevented.

Figure 7:
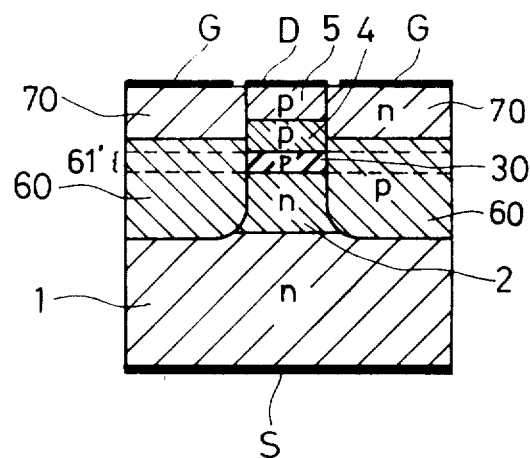
FIG. 7 is a schematic sectional elevation view of the semiconductor laser in accordance with a second embodiment of the present invention.
Figure 8:
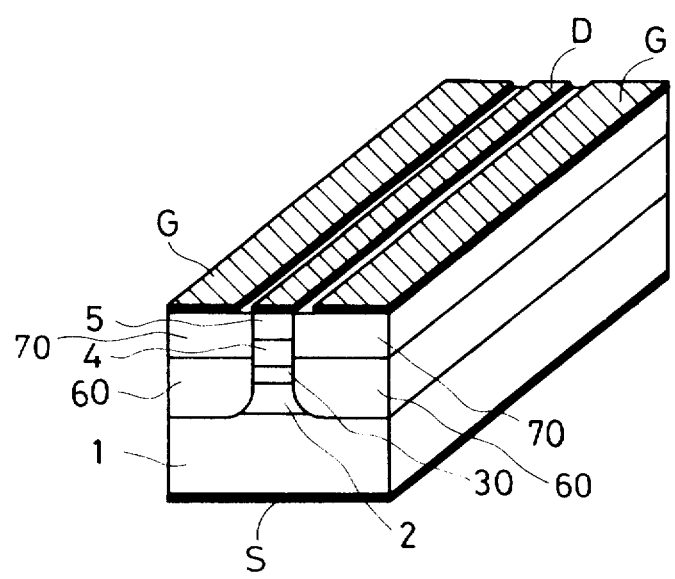
FIG. 8 is a perspective view of the semiconductor laser of FIG. 7.

Another embodiment of the present invention will be explained below. In this embodiment, an active layer is formed by the opposite conductivity type to that of the first clad layer, and the pn junctions between the first and second buried layers are disposed at a level higher than the upper face of the active layer. FIG. 7 shows a sectional view of this embodiment and corresponds to FIG. 3(a) of the first embodiment. An active layer formed on the n-type first clad layer 2 is of p-type GaAs having a carrier concentration within a range of $1\times10^{17}$ to $5\times10^{18}$ cm$^{-3}$, and preferably at $1\times10^{17}$ cm$^{-3}$. The double heterostructure formed by the first and second clad layers 2, 4 and the active layer therebetween, and the cap layer 5 on the double heterostructure, are formed in the same way as those of the first embodiment shown in FIGS. 1 to 6. Then, the semiconductor layers 2, 30, 4 and 5 grown by a sequential epitaxial growth method are mesa-etched retaining the center portion (width of about 10 μm) as a stripe shape, and two buried layers 60 and 70 in the recessed parts, are formed in the etched-away parts by a sequential epitaxial growth method. First buried layers 60 are p-type GaAs layers having a carrier concentration within a range of $1\times10^{16}$ to $5\times10^{17}$ cm$^{-3}$, and preferably at $1\times10^{17}$ cm$^{-3}$, and are formed by the epitaxial growth method till a position higher than the upper face of the active layer 30 by about 0.2 μm. Thin layers 61' are intermediate parts of the first buried layers 60, and the levels of the upper face and lower face of the thin layers 61' are equal to those of the active layer 30. Then the second buried layers 70 of n-type Ga$_{1-w}$Al$_w$As (w=0 to 0.5) are formed on the first buried layers 60 to reach the same face as that of the cap layer 5 by an epitaxial growth method. The carrier concentration of the second buried layers 70 is selected to be within a range of $1\times10^{17}$ to $5\times10^{18}$ cm$^{-3}$, and preferably at $1\times10^{18}$ cm$^{-3}$. A drain electrode D, gate electrodes G and a source electrode S are formed on the cap layer 5, on the second buried layers 70 and on the rear side of the semiconductor substrate 1, respectively. The perspective view of this embodiment of the semiconductor laser is shown in FIG. 8.

Figure 9:
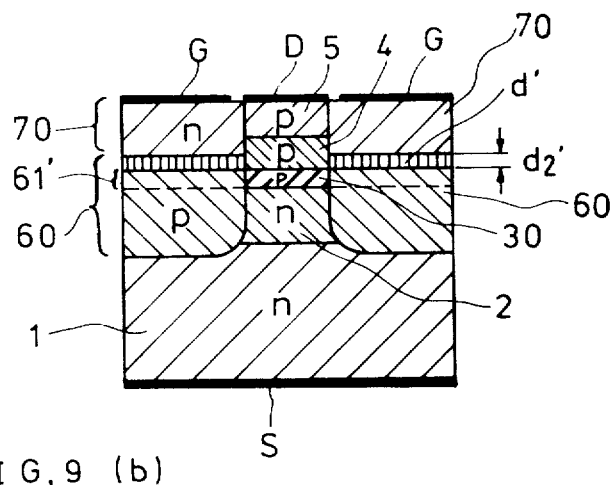
FIG. 9(a) and FIG. 10(a) are schematic sectional elevation view when a low and a high voltage are applied to the gate electrodes, respectively.
FIG. 9(b) and FIG. 10(b) are graphs showing refractive index distribution with respect to lateral direction of the active layer.
Figure 9:
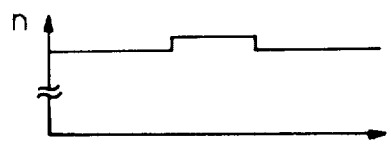
Figure 10:
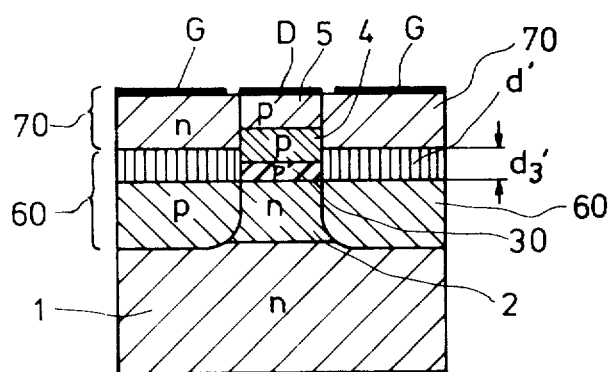
Figure 10:
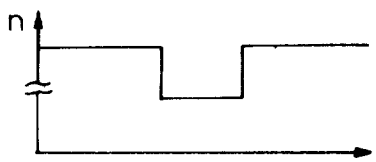

The operation of this semiconductor laser will be explained below referring to FIGS. 9 and 10. When a drain voltage $V_D$ and a gate voltage $V_G$ against the source electrode S are selected equally to be 1.43 V, and accordingly, a forward current flows through the pn hetero junction of the active layer 30 and the first clad layer 2, and a reverse-bias voltage is applied across the pn junction between the first and second buried layers 60 and 70, then depletion layers d' are produced as shown in FIG. 9(a). In this embodiment, unlike the first embodiment, the depletion layers d' are produced almost on the lower side of the pn junction, namely in the top face region of the first buried layers 60, since the carrier concentration of the first buried layers 60 is selected to be lower than that of the second buried layers 70. The thickness of the depletion layers d' is about 0.21 μm when the carrier concentration of the first buried layers 60 is equal to that of the first embodiment. Therefore, the depletion layers d' are not formed in thin layers 61' on both sides of the active layer 30. FIG. 9(b) shows a refractive index distribution along the lateral direction passing through the active layer 30 and the thin layers 61'. As shown in FIG. 9(b), the refractive index of the active layer 30 is slightly higher than those of the thin layers 61', thereby laser light is confined with respect to the lateral direction. Therefore, when a voltage larger than a specified value is applied across the source and drain electrodes S and D, a laser oscillation can be obtained.

Next, when the gate voltage $V_G$ is increased to 6.4 V, while keeping drain voltage $V_D$ at 1.43 V, the depletion layers d' grow thicker because of the increase of the reverse-bias voltage impressed across the buried layers 60 and 70. As shown in FIG. 10(a), the depletion layers d' spread downwards into the buried layers 60, and the thickness d$_3$' thereof becomes 0.34 μm as mentioned above. When the thickness of the active layer 30 is about 0.15 μm, the thin layers 61' are almost contained within the spread depletion layers d'. Hereupon, the refractive index change Δn(ΔN) due to the carrier concentration difference between before and after generation of the depletion layers, is $1.4\times10^{-4}$ according to equation (2). The electric field strength in the depletion layers d' is $2.35\times10^5$ V/cm according to equation (5), and the refractive index change Δn(E) due to the electric field strength is $8\times10^{-4}$ according to equation (3). An original difference of the refractive indexes between the active layer 30 and the buried layers 60 is about $1\times10^{-4}$. Consequently, the difference of the refractive indexes becomes $8.4\times10^{-4}$ similarly to the first embodiment, that is, the refractive index of the active layer 30 is lower than those of the thin layers 61' as shown in FIG. 10(b). Therefore, the laser light leaks outside the active layer 30, and laser oscillation stops. As a result of this, the laser oscillation can be controlled by the gate voltage $V_G$.

Figure 11:
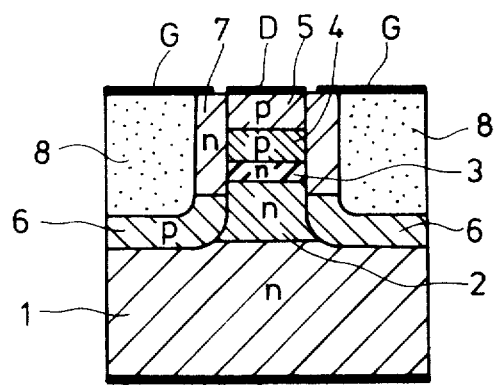
FIGS. 11(a) and 12(a) are schematic sectional elevation views of semiconductor lasers in accordance with another embodiments of the present invention when no voltage is applied to the gate electrodes.
FIGS. 11(b) and 12(b) are schematic sectional elevation views when a voltage is applied to the gate electrodes, respectively.
Figure 11:
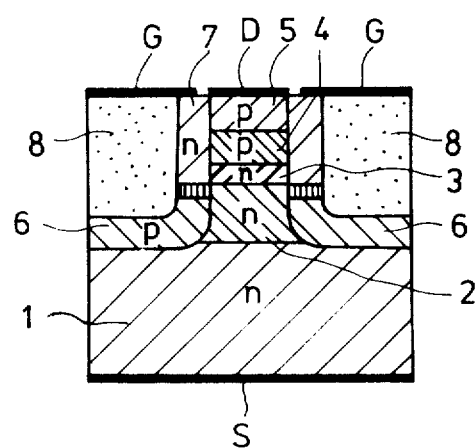
Figure 12:
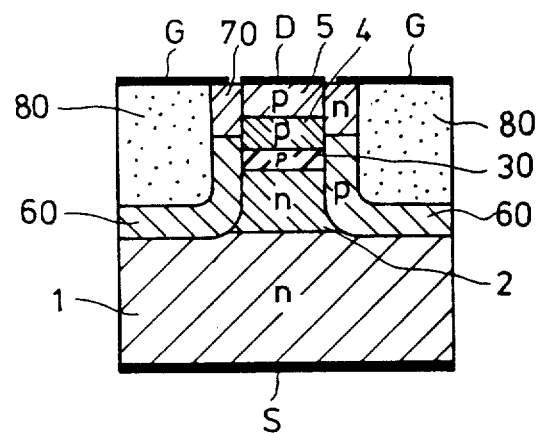
Figure 12:
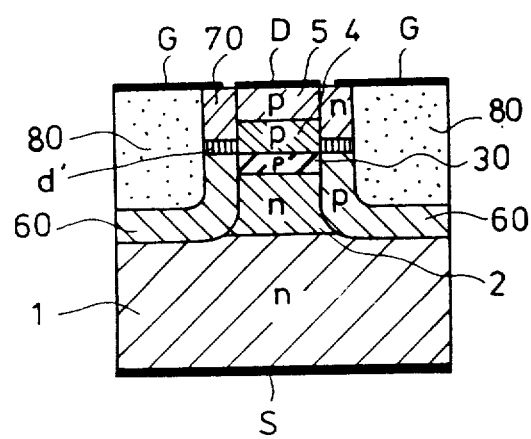

Next, another embodiment for improving the switching speed of the semiconductor laser disclosed in the present application will be explained below, referring to the schematic sectional views of FIGS. 11 and 12. In this embodiment, still another layers 8 are formed as embraced in each pair of the two buried layers. After forming the second buried layers 7 as shown in FIG. 2(c), protons are bombarded into the buried layers 6 and 7 at parts other than the center part of a predetermined width, thereby forming proton-bombarded layers 8 as shown in FIG. 11(a). The depth of the proton-bombarded layers 8 are selected deeper than that of the junction interface between the first and second buried layers 6 and 7. In this embodiment, the depletion layers are generated only at parts of the junction interface between the first and second buried layers 6 and 7 while they are not generate in the proton-bombarded layers 8 as shown in FIG. 11(b). Therefore, a lateral width of the depletion layer d becomes very narrow, and the capacitance thereof becomes small. When the same voltage is applied to the gate and drain electrodes G and D against the source electrode S, the capacitance of the depletion layers can be limited below 1 pF, thereby ensuring a high switching speed.

The proton-bombarded layers can be provided also to the abovementioned second embodiment as shown in FIGS. 12(a) and 12(b). In this embodiment, the depth of the proton-bombarded layers 80 are selected deeper than the higher face of the active layer 30 in order to reduce the capacitance of the depletion layers d' as mentioned above.

In the abovementioned embodiments of FIGS. 3, 7, 11 and 12, the second buried layers 7 (or 70) and the first buried layers 6 (or 60) are made of GaAs,. However, the effective refractive index of the active layer reduces when the semiconductor laser oscillates at a specified mode. Therefore, the second buried layers 7 (or 70) and first buried layers 6 (or 60) are made of $Ga_{1-z'}Al_{z'}As$, $Ga_{1-w'}Al_{w'}As$, respectively in order to compensate the reduction of the refractive index of the active layer, and proper values for z' and w' with selecting the effective refractive index of the active layer for a specified mode, can be kept higher than that of the adjacent buried layers as shown in FIG. 5(b) or 9(b).

In the abovementioned embodiments of FIGS. 3, 7, 11 and 12 the active layer is made of GaAs, but it can be made of a ternary compound, such as GaAlAs, and in such a case, the second buried layers 7 (or 70) or the first buried layers 6 (or 60) should be made of GaAlAs.

In the abovementioned embodiments, GaAs-GaAlAs semiconductor materials are used, but InP-InGaAsP semiconductor materials can be also selected.

Although all of the embodiments are applied to a semiconductor laser having a mesa part of a straight stripe shape, they can be also applied to a semiconductor laser having a mesa part of an L-shaped or U shaped stripe.

As shown in the embodiments, it is preferable to provide two gate electrodes G on each of two second buried layers, but the device may be made with only one gate electrode G on either one of the second buried layers, or alternatively, one of the gate electrodes G may be formed so as to be in contact with the drain electrode D.

According to the present invention, the oscillation of the laser can be directly controlled by the external voltage. In this case, a current through the source and drain electrodes S and D is maintained at constant. The modulation speed by the conventional direct modulation depends essentially on the life of carrier, while in present invention as the loss in the laser cavity is controlled by the external voltage, the modulation speed over several GHz can be obtained. Furthermore, since little current flows through the gate electrodes, input impedance of the gate electrodes is very high, thereby enabling use of a simplified driving circuit for the semiconductor laser. In addition, the structure of this device per se is comparatively simple.

What we claimed is:

1. A field effect semiconductor laser comprising:
   a semiconductor substrate,
   a stripe-shaped mesa part of a double heterostructure including a first clad layer, an active layer, and a second clad layer on the top face of said semiconductor substrate in this order, both of said first and said second clad layers having lower refractive indices than that of said active layer,
   buried layers buried in both side parts of said stripe-shaped mesa part on said semiconductor substrate,
   electrodes provided on the bottom surface of said semiconductor substrate and on said second clad layer,
   characterized in that
   said active layer has the same conductivity type as that of said first clad layer, light reflecting faces at both ends thereof being cleavage planes of (011),
   that each of said buried layers comprises a first buried layer formed on said semiconductor substrate and a second buried layer thereon where said first and said second buried layers have conductivity types different from each other so that these buried layers are reverse-biased when a voltage of the same direction as the forward direction of a voltage to be applied to said stripe-shaped mesa part is applied to said second buried layer,
   that a carrier concentration of said second buried layers is lower than that of said first buried layers,
   that said first buried layers are formed in a manner that junction interfaces between said first and said second buried layers are disposed lower by a predetermined level difference than a junction place between said first clad layer and said active layer, and
   that an electrode is formed on at least one of said second buried layers.

2. A field effect semiconductor laser in accordance with claim 1, further comprising a cap layer formed between said second clad layer and said electrode above said second clad layer thereon.

3. A field effect semiconductor laser in accordance with claim 1 or 2, wherein said active layer is formed by GaAs, and said first and said second clad layers are formed by $Ga_{1-x}Al_xAs$ (x=0.3 to 0.5) and $Ga_{1-y}Al_yAs$ (y=0.3 to 0.5), respectively.

4. A field effect semiconductor laser in accordance with claim 1 or 2, wherein said semiconductor substrate, said first clad layer, said active layer and said second buried layers are of n-type, and said second clad layer and said first buried layers are of p-type.

5. A field effect semiconductor laser in accordance with claim 4, wherein a carrier concentration of said active layer is lower than that of said second buried layers.

6. A field effect semiconductor laser in accordance with claim 5, wherein a carrier concentration of said active layer is selected to be within a range of $5\times10^{15}$ to $5\times10^{16} cm^{-3}$.

7. A field effect semiconductor laser in accordance with claim 5, wherein a carrier concentration of said first buried layers is selected to be within a range of $1\times10^{17}$ to $5\times10^{18} cm^{-3}$.

8. A field effect semiconductor laser in accordance with claim 5, wherein a carrier concentration of said second buried layers is selected to be within a range of $1\times10^{16}$ to $5\times10^{17} cm^{-3}$.

9. A field effect semiconductor laser in accordance with claim 1 or 2, wherein
   proton-bombarded layers are provided in said first and said second buried layers in a manner to be separated from said stripe-shaped mesa part with a predetermined gap therebetween, the depth of said proton-bombarded layers being deeper than that of the junction plane between said first and second buried layers.

10. A field effect semiconductor laser comprising:
    a semiconductor substrate,
    a stripe-shaped mesa part of a double heterostructure including a first clad layer, an active layer, and a second clad layer on the top face of said semiconductor substrate in this order, both of said first and said second clad layers having lower refractive indices than that of said active layer,
    buried layers buried in both side parts of said stripe-shaped mesa part on said semiconductor substrate,
    electrodes provided on the bottom surface of said semiconductor substrate and on said second clad layer, characterized in that said active layer has the opposite conductivity type to that of said first clad layer, light reflecting faces at both ends thereof being cleavage planes of (011), that each of said buried layers comprises a first buried layer formed on said semiconductor substrate and a second buried layer thereon where said first and said second buried layers have conductivity types different from each other so that these buried layers are reverse-biased when a voltage of the same direction as the forward direction of a voltage to be applied to said stripe-shaped mesa part is applied to said second buried layers, that a carrier concentration of said second buried layers is higher than that of said first buried layers, that said first buried layers are formed in a manner that junction interfaces between said first and said second buried layers are disposed higher by a predetermined level difference than a junction plane between said second clad layer and said active layer, and that an electrode is formed on at least one of said second buried layers.

11. A field effect semiconductor laser in accordance with claim 10, further comprising a cap layer formed between said second clad layer and said electrode above said second clad layer thereon.

12. A field effect semiconductor laser in accordance with claim 10 or 11, wherein said active layer is formed by GaAs, and said first and said second clad layers are formed by $Ga_{1-x}Al_xAs$ (x=0.3 to 0.5) and $Ga_{1-y}Al_yAs$ (y=0.3 to 0.5), respectively.

13. A field effect semiconductor laser in accordance with claim 10 or 11, wherein said semiconductor substrate, said first clad layer and said second buried layers are of n-type, and said active layer, said second clad layer and said first buried layers are of p-type.

14. A field effect semiconductor laser in accordance with claim 13, wherein a carrier concentration of said active layer is higher than that of said first buried layers.

15. A field effect semiconductor laser in accordance with claim 14, wherein a carrier concentration of said active layer is selected to be within a range of $1 \times 10^{17}$ to $5 \times 10^{18} cm^{-3}$.

16. A field effect semiconductor laser in accordance with claim 14, wherein a carrier concentration of said first buried layers is selected to be within a range of $1 \times 10^{16}$ to $5 \times 10^{17} cm^{-3}$.

17. A field effect semiconductor laser in accordance with claim 14, wherein a carrier concentration of said second buried layers is selected to be within a range of $1 \times 10^{17}$ to $5 \times 10^{18} cm^{-3}$.

18. A field effect semiconductor laser in accordance with claim 10 or 11, wherein proton-bombarded layers are provided in said first and said second buried layers in a manner to be separated from said stripe-shaped mesa part with a predetermined gap therebetween, the depth of said proton-bombarded layers being deeper than the highest face of said active layer.

19. A field effect semiconductor laser comprising:

a semiconductor substrate, a stripe-shaped mesa part of a double heterostructure including a first clad layer, an active layer, a second clad layer and a cap layer on the top face of said semiconductor substrate in this order, both of said first and said second clad layers having lower refractive indexes than that of said active layer, buried layers buried in both side parts of said stripe-shaped mesa part on said semiconductor substrate, each of said buried layers comprising a first buried layer formed on said semiconductor substrate and a second buried layer thereon where said first and said second buried layers have conductivity types different from each other so that these buried layers are reverse-biased when a voltage of the same direction as the forward direction of a voltage to be impressed across said stripe-shaped mesa part, is impressed across said second buried layer and said semiconductor substrate, an anode electrode, a cathode electrode and at least one gate electrode provided respectively on said cap layer, the bottom surface of said semiconductor substrate and said second buried layers, characterized in that said active layer has the same conductivity type as that of said first clad layer, light reflecting faces at both ends thereof being cleavage planes of (011), that each of said second buried layers disposed on both sides of said active layer completely covers both light reflecting side faces of said active layer in a manner that junction interfaces between said first and said second buried layers are disposed nearer to said semiconductor substrate by a predetermined level difference than the junction interface between said first clad layer and said active layer, that a carrier concentration in said second buried layers is same as or higher than that of said active layer, so that a refractive index value thereof is substantially of the same order as that of said active layer, that a refractive index value in predetermined regions of said second buried layers covering both side faces of said active layer and in contact with at least one of said light reflecting side faces of said active layer, becomes higher than that of said active layer due to carrier concentration difference and electro-optic effect so that laser oscillation stops at a first predetermined voltage, when a second predetermined voltage higher than a voltage impressed across said anode and said cathode electrodes for lasing operation and lower than said first predetermined voltage, is impressed across said at least one gate electrode and said cathode electrode.

20. A field effect semiconductor laser in accordance with claim 19, wherein said active layer is GaAs, and said first and said second buried layers are $Ga_{1-x}Al_xAs$ (x=0 to 0.5) and GaAs, respectively.

21. A field effect semiconductor laser in accordance with claim 19, wherein said semiconductor substrate, said first clad layer, said active layer and said second buried layers are of n-type, and said second clad layer and said first buried layers are of p-type.

22. A field effect semiconductor laser in accordance with claim 19, wherein a carrier concentration of said first buried layers is selected to be within a range of $1 \times 10^{17}$ to $5 \times 10^{18} cm^{-3}$.

23. A field effect semiconductor laser in accordance with clim 19, wherein a carrier concentration of said second buried layers is selected to be within a range of $1 \times 10^{16}$ to $5 \times 10^{17} cm-3$, and is the same as or higher than that of said active layer.

24. A field effect semiconductor laser in accordance with claim 21, wherein a carrier concentration of said second buried layer is lower than that of said first buried layers.

25. A field effect semiconductor laser in accordance with claim 19, wherein proton-bombarded layers are provided in said first and said second buried layers in manner to be separated from said stripe-shaped mesa part with a predetermined gap therebetween,
the depth of said proton-bombarded layers being deeper than that of the junction plane between said first and said second buried layers.

26. A field effect semiconductor laser comprising:
a semiconductor substrate,
a stripe-shaped mesa part of a double heterostructure including a first clad layer, an active layer, a second clad layer and a cap layer on the top face of said semiconductor substrate in this order, both of said first and said second clad layers having lower refractive indexes than that of said active layer,
buried layers buried in both side parts of said stripe-shaped mesa part on said semiconductor substrate, each of said buried layers comprising a first buried layer formed on said semiconductor substrate and a second buried layer thereon where said first and said second buried layers have conductivity types different from each other so that these buried layers are reverse-biased when a voltage of the same direction as the forward direction of a voltage to be impressed across said stripe-shaped mesa part, is impressed across said second buried layer and said semiconductor substrate,
an anode electrode, a cathode electrode and at least one gate electrode provided respectively on said cap layer, the bottom surface of said semiconductor substrate and said second buried layers,
characterized in that
said active layer has the different conductivity type from that of said first clad layer, light reflecting faces at both ends thereof being cleavage planes of (011),
that each of said first buried layers disposed on both sides of said active layer completely covers both light reflecting side faces of said active layer in a manner that junction interfaces between said first and said second buried layers are disposed nearer to said cap layer by a predetermined level difference than the junction interface between said second clad layer and said active layer,
that a carrier concentration in said first buried layers is the same as or lower than that of said active layer, so that a refractive index value thereof is substantially of the same order as that of said active layer,
that a refractive index value in predetermined regions of said first buried layers covering both side faces of said active layer and in contact with at least one of said light reflecting side faces of said active layer, becomes higher than that of said active layer due to carrier concentration difference and electro-optic effect so that laser oscillation stops at a first predetermined voltage, when a second predetermined voltage higher than a voltage impressed across said anode and said cathode electrodes for lasing operation and lower than said first predetermined voltage, is impressed across said at least one gate electrode and said cathode electrode.

27. A method of modulating refractive indexes in a field effect semiconductor laser of the type which includes
a stripe-shaped mesa part of a double heterostructure on a semiconductor substrate at the center thereof, the stripe-shaped mesa part comprising an active layer doped with impurity atoms of a conductivity type the same as that of impurity atoms doped in the first clad layer, with light reflection faces on both sides thereof of (011) cleavage face direction, and with a refractive index $n_1$, sandwiched by a first lower and a second higher clad layers both with another refractive index $n_2$ smaller than $n_1$, and a cap layer on said second clad layer,
a pair of a first lower and a second higher buried layers disposed on both sides of the stripe-shaped mesa part and on the semiconductor substrate,
an anode on the cap layer, at least one gate on at least one layer among the two second buried layers, and a cathode on the rear surface of the semiconductor substrate, these electrodes being separated from one another,
the junction of the first lower and said second higher buried layers completely covering the light reflection faces, and having a height $h_1$ slightly lower to the side of the semiconductor substrate than a height $h_2$ of the junction position of the first lower clad layer and the active layer, the first lower and the second higher buried layers being doped with impurity atoms of conductivity types different from each other and reverse-biased when a voltage with a polarity the same as that of a voltage impressed across the stripe-shaped mesa part is impressed across the second higher buried layer and the semiconductor substrate, and
a carrier concentration in the second higher buried layer being equal to or higher than a counterpart in the active layer so that a refractive index in the second higher buried layer is substantially on the same order as a counterpart in the said active layer,
the method of modulating a refractive index in a predetermined region facing to at least one face of the light reflection faces and in the second higher buried layer due to carrier concentration difference and electro-optic effect by the steps of modulating a reverse bias voltage across the gate and cathode while impressing a predetermined voltage specified for laser operation across the anode and the cathode.

28. A method of modulating refractive indexes in a field effect semiconductor laser of the type which includes
a stripe-shaped mesa part of a double heterostructure on a semiconductor substrate at the center thereof, the stripe-shaped mesa part comprising an active layer doped with impurity atoms of a conductivity type opposite to that of impurity atoms doped in the first clad layer, with light reflection faces on both sides thereof of (011) cleavage face direction, and with a refractive index $n_3$, sandwiched by a first lower and a second higher clad layers both with another refractive index $n_4$ smaller than $n_3$, and a cap layer on the second clad layer,
a pair of first lower and a second higher buried layers disposed on both sides of the stripe-shaped mesa part and on the semiconductor substrate,
an anode on the cap layer, at least one gate on at least one layer among the two second buried layers, and a cathode on the rear surface of the semiconductor substrate, these electrodes being separated from one another, the junction of the first lower and said second higher buried layers completely covering said light reflection faces, and having a height $h_3$ slightly higher to the side of the cap layer than a height $h_4$ of junction position of the first lower clad layer and the active layer, the first lower and the second higher buried layers being doped with impurity atoms of conductivity types different from each other and reverse-biased when a voltage with a polarity the same as that of a voltage impressed across the stripe-shaped mesa part is impressed across the stripe-shaped mesa part is impressed across the second higher buried layer and the semiconductor substrate, and a carrier concentration in the first lower buried layer being equal to or lower than a counterpart in the active layer so that a refractive index in the first lower buried layer is substantially on the same order as a counterpart in the active layer, the method of modulating a refractive index in a predetermined region facing to at least one face of the light reflection faces and in the first lower buried layer due to carrier concentration difference and electro-optic effect comprising the steps of modulating a reverse bias voltage across the gate and cathode while impressing a predetermined voltage specified for laser operation across the anode and the cathode.

* * * * *